United States Patent
Li

(10) Patent No.: US 11,522,120 B1
(45) Date of Patent: Dec. 6, 2022

(54) MICRO CRYSTAL OSCILLATOR

(71) Applicant: YOKETAN CORPORATION, Taichung (TW)

(72) Inventor: Wang-Chuan Li, Taichung (TW)

(73) Assignee: Yoketan Corp., Taichung (TW)

( * ) Notice: Subject to any disclaimer, the term of this patent is extended or adjusted under 35 U.S.C. 154(b) by 0 days.

(21) Appl. No.: 17/305,316

(22) Filed: Jul. 2, 2021

(51) Int. Cl.
- *H03B 5/32* (2006.01)
- *H01L 41/047* (2006.01)
- *H01L 41/053* (2006.01)

(52) U.S. Cl.
CPC .......... *H01L 41/047* (2013.01); *H01L 41/053* (2013.01); *H03B 5/32* (2013.01)

(58) Field of Classification Search
CPC ........ H01L 41/047; H01L 41/053; H03B 5/32
USPC ........................................................ 331/158
See application file for complete search history.

(56) References Cited

U.S. PATENT DOCUMENTS

| | | | |
|---|---|---|---|
| 2004/0070462 A1* | 4/2004 | Alhayek | H03H 3/02 331/158 |
| 2012/0032561 A1* | 2/2012 | Mizusawa | H03H 9/0595 310/344 |
| 2015/0143903 A1* | 5/2015 | Aoki | G01C 19/5628 73/504.12 |
| 2018/0097474 A1* | 4/2018 | Aoki | H03B 5/32 |
| 2018/0097476 A1* | 4/2018 | Aoki | H03H 9/0547 |

\* cited by examiner

*Primary Examiner* — Richard Tan
(74) *Attorney, Agent, or Firm* — Wang Law Firm, Inc.

(57) ABSTRACT

A micro crystal oscillator includes: a tank body including a tank bottom and a side wall, the tank bottom including an inner surface and an outer surface, wherein the side wall is disposed on a periphery of the inner surface of the tank bottom to form a recess together with the tank bottom; a plurality of patterned electrodes arranged on the outer surface; a first patterned circuit arranged on the side wall; a plurality of vias disposed in the tank body for electrically connecting at least one of the patterned electrodes to the first patterned circuit; an oscillating chip arranged on the inner surface and located in the recess; and a plurality of connecting wires located in the recess and respectively connected to the oscillating chip and the first patterned circuit in a wire bonding manner; wherein the micro crystal oscillator is of millimeter level.

15 Claims, 5 Drawing Sheets

MICRO CRYSTAL OSCILLATOR

BACKGROUND

Field of the Invention

The present invention relates to a packaging structure of an oscillator, and more particularly to a micro crystal oscillator using the wire bonding technology.

Description of Related Art

The internal bonding methods for integrated circuit packaging can be roughly divided into wire bonding, tape automatic bonding, and flip-chip bonding. Among them, wire bonding is currently the most widely used bonding technology due to its mature process, low cost, and high flexibility of routing, accounting for about 90% of all packaged products. However, with the advancement of technology and application requirements, the size of the oscillator is getting smaller and smaller. Therefore, more and more manufacturers replace packaging equipment using the wire bonding technology suitable for large-size packaging structures, by packaging equipment using the flip-chip bonding technology suitable for small-size packaging structures. However, replacing packaging equipment will greatly increase the manufacturer's production costs.

SUMMARY

Therefore, the main objective of the present invention is to provide a micro crystal oscillator using the wire bonding technology.

To achieve the above objective, a micro crystal oscillator in accordance with one embodiment of the invention includes: a tank body including a tank bottom and a side wall, the tank bottom including an inner surface and an outer surface, wherein the side wall is disposed on a periphery of the inner surface of the tank bottom to form a recess together with the tank bottom; a plurality of patterned electrodes arranged on the outer surface of the tank bottom; a first patterned circuit arranged to the side wall; a plurality of vias disposed in the tank body for electrically connecting at least one patterned electrode of the plurality of patterned electrodes to the first patterned circuit; an oscillating chip arranged on the inner surface of the tank bottom and located in the recess; and a plurality of connecting wires located in the recess and respectively connecting the oscillating chip to the first patterned circuit in a wire bonding manner, wherein the micro crystal oscillator is millimeter-sized.

In another embodiment of the invention, the maximum length of the micro crystal oscillator is defined as L, and the micro crystal oscillator meets the following condition: 1 mm<L<2 mm. Preferably, the micro crystal oscillator meets the following condition: 1.6 mm≤L≤1.7 mm. More preferably, the size of the micro crystal oscillator is 1.65 mm×1.25 mm.

In yet another embodiment of the invention, the micro crystal oscillator further includes a second patterned circuit disposed to the side wall, the second patterned circuit is located above the first patterned circuit and separated from the first patterned circuit, the first patterned circuit is located between the second patterned circuit and the tank bottom, and the plurality of vias electrically connect at least one patterned electrode of the plurality of patterned electrodes, the first patterned circuit and the second patterned circuit to one another.

In yet another embodiment of the invention, the micro crystal oscillator further includes at least one lateral electrode disposed on an outer surface of the side wall and contacting the second patterned circuit.

In yet another embodiment of the invention, the side wall is rectangular, and the lateral electrode is located at one of four corners of the side wall.

In yet another embodiment of the invention, the micro crystal oscillator further includes a third patterned circuit disposed on the inner surface of the tank bottom, the third patterned circuit is located between the first patterned circuit and the outer surface of the tank bottom, and the plurality of vias electrically connect at least one patterned electrode of the plurality of patterned electrodes, the first patterned circuit and the third patterned circuit to one another. Or, in yet another embodiment of the invention, the micro crystal oscillator further includes a fourth patterned circuit disposed between the inner surface and the outer surface of the tank bottom, and the plurality of vias electrically connect at least one patterned electrode of the plurality of patterned electrodes, the first patterned circuit and the fourth patterned circuit to one another.

In yet another embodiment of the invention, the micro crystal oscillator further includes: a second patterned circuit disposed to the side wall, wherein the second patterned circuit is located above the first patterned circuit located between the second patterned circuit and the tank bottom; at least one lateral electrode disposed on an outer surface of the side wall and contacting the second patterned circuit; a third patterned circuit disposed on the inner surface of the tank bottom and located between the first patterned circuit and the outer surface of the tank bottom; and a fourth patterned circuit disposed between the inner surface and the outer surface of the tank bottom, wherein the first patterned circuit, the second patterned circuit, the third patterned circuit, the fourth patterned circuit and at least one patterned electrode of the plurality of patterned electrodes are separated from each other and electrically connected to each other through the plurality of vias.

In yet another embodiment of the invention, the second patterned circuit is electrically connected to the third patterned circuit through the at least one lateral electrode.

In yet another embodiment of the invention, the micro crystal oscillator further includes: a second patterned circuit disposed to the side wall, wherein the second patterned circuit is located above the first patterned circuit located between the second patterned circuit and the tank bottom; at least one lateral electrode disposed on an outer surface of the side wall; a third patterned circuit disposed on the inner surface of the tank bottom and located between the first patterned circuit and the outer surface of the tank bottom; and a fourth patterned circuit disposed between the inner surface and the outer surface of the tank bottom, wherein the first patterned circuit, the second patterned circuit, the third patterned circuit, the fourth patterned circuit and at least one patterned electrode of the plurality of patterned electrodes are separated from each other and electrically connected to each other through the plurality of vias. The side wall is rectangular, and the lateral electrode is located at one of four corners of the side wall.

In yet another embodiment of the invention, the second patterned circuit includes at least one conductive wire, the conductive wire is abutted against the outer surface of the side wall, and a part of the conductive wire extends to the outer surface of the side wall to contact the lateral electrode.

In yet another embodiment of the invention, a part of the first patterned circuit, a part of the second patterned circuit, and a part of the third patterned circuit are exposed at an opening of the tank body.

In yet another embodiment of the invention, the micro crystal oscillator further includes: a plurality of circuit layers stacked to form the side wall, and the first patterned circuit and the second patterned circuit are arranged in the plurality of circuits layers, each circuit layer of the plurality of circuit layers includes an opening, and the opening of the circuit layer farther from the oscillating chip is larger.

In yet another embodiment of the invention, the micro crystal oscillator is a clock crystal oscillator (CXO), a temperature compensated crystal oscillator (TCXO), or a voltage-controlled crystal oscillator (VCXO).

In this way, the micro crystal oscillator provided by this invention uses structural design (or space planning) on the side wall of the tank body to allow the oscillating chip to be electrically connected to the side wall of the tank body through wire bonding technology, so that the wire bonding technology that was originally suitable for only large-size package structures can also be applied to small-size package structures with a maximum length of less than 2 mm. Therefore, the chip manufacturer does not need to replace the packaging equipment using the wire bonding technology by the packaging equipment using the flip chip bonding technology in order to produce micro crystal oscillators.

BRIEF DESCRIPTION OF THE DRAWINGS

After studying the detailed description in conjunction with the following drawings, other aspects and advantages of the present invention will be discovered.

DETAILED DESCRIPTION

Figure 1:
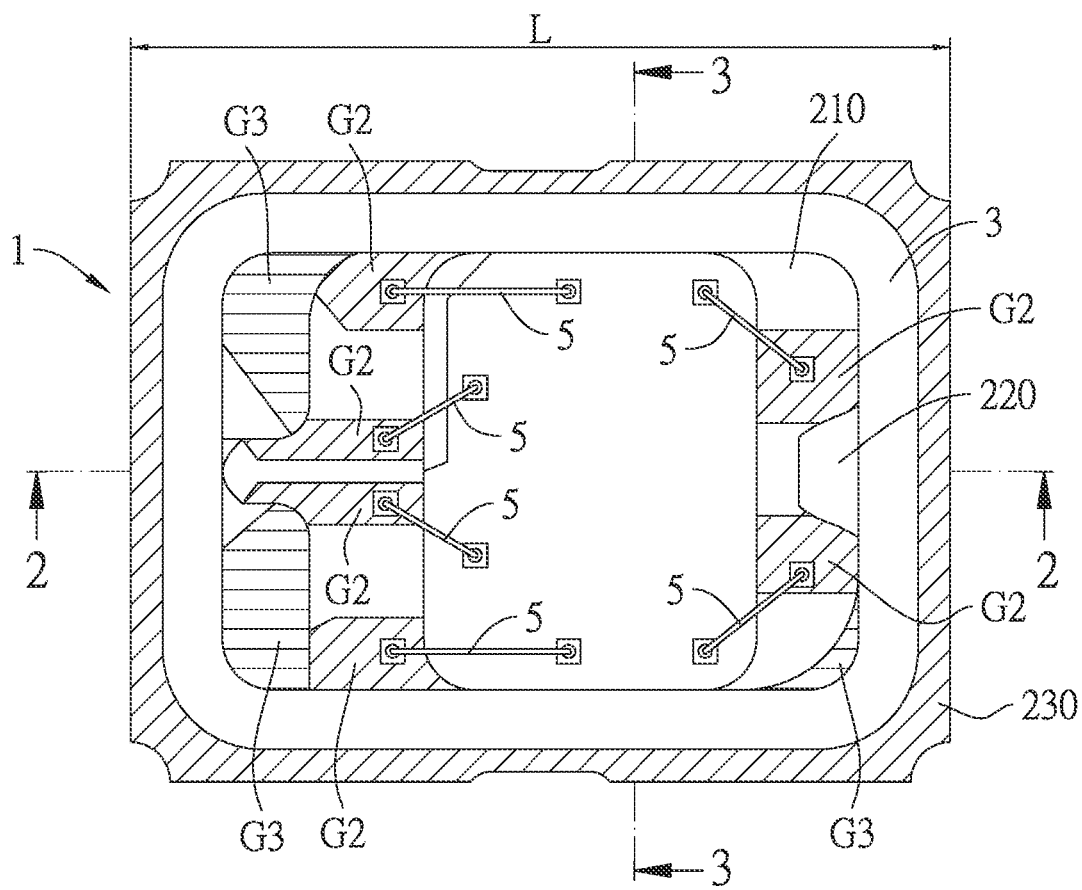
FIG. 1 is a top view of a micro crystal oscillator, a packaging board of which has been removed, according to an embodiment of the present creation.
Figure 2:
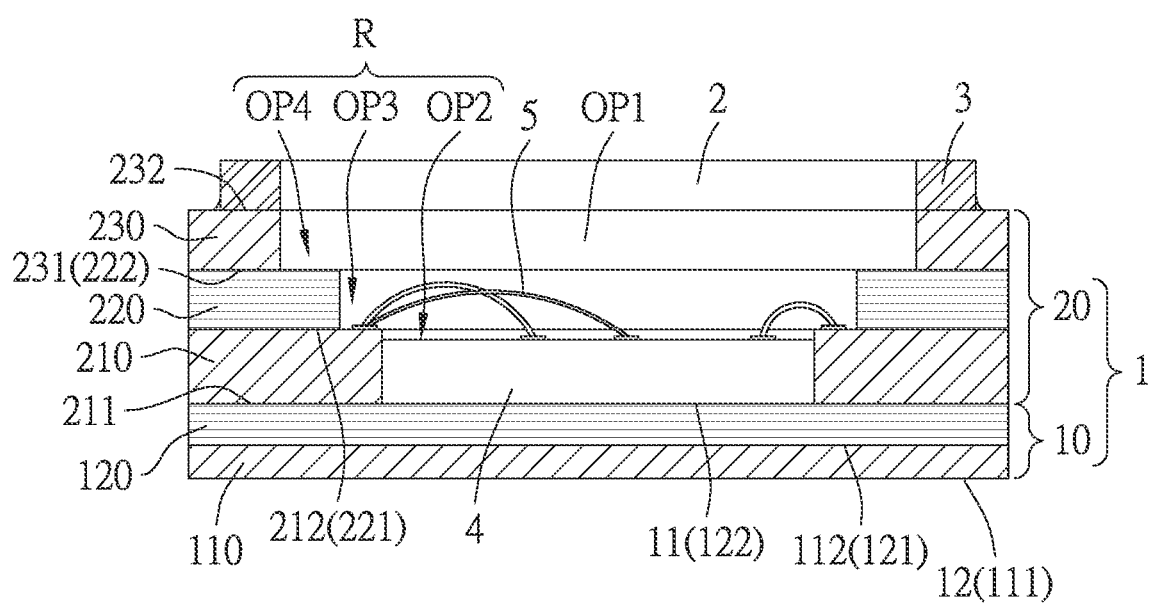
FIG. 2 is a cross-sectional view of the micro crystal oscillator of FIG. 1 drawn along a cross-sectional line 2-2.
Figure 3:
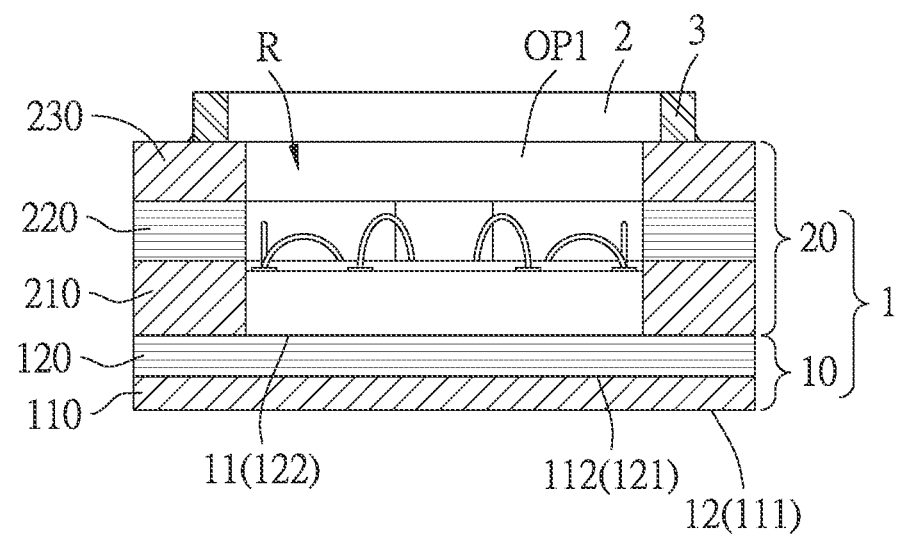
FIG. 3 is a cross-sectional view of the micro crystal oscillator of FIG. 1 drawn along a cross-sectional line 3-3.

Referring to FIGS. 1-9, the micro crystal oscillator provided by an embodiment of the invention is a millimeter-sized micro crystal oscillator. The maximum length of this micro crystal oscillator is defined as L, and the micro crystal oscillator meets the following condition: 1 mm<L<2 mm. Preferably, the micro crystal oscillator meets the following condition: 1.6 mm≤L≤1.7 mm. More preferably, the size of the micro crystal oscillator is 1.65 mm×1.25 mm.

The micro crystal oscillator includes a tank body 1, a packaging board 2, a sealing layer 3 (for example, a sealing ring) used to fix the packaging board 2 at an opening OP1 of the tank body 1, and an oscillating chip 4 disposed in the tank body 1, and a plurality of connecting wires 5 for electrically connecting the oscillating chip 4 to the tank body 1. The tank body 1 is in the form of a substantially rectangular columnar structure. The tank body 1 includes a tank bottom 10 and a side wall 20. The tank bottom 10 includes an inner surface 11 and an outer surface 12. The side wall 20 is disposed on a periphery of the inner surface 11 of the tank bottom 10 to form a recess R together with the tank bottom 10. Two opposite inner surfaces of the side wall 20 are substantially stepped.

Figure 4:
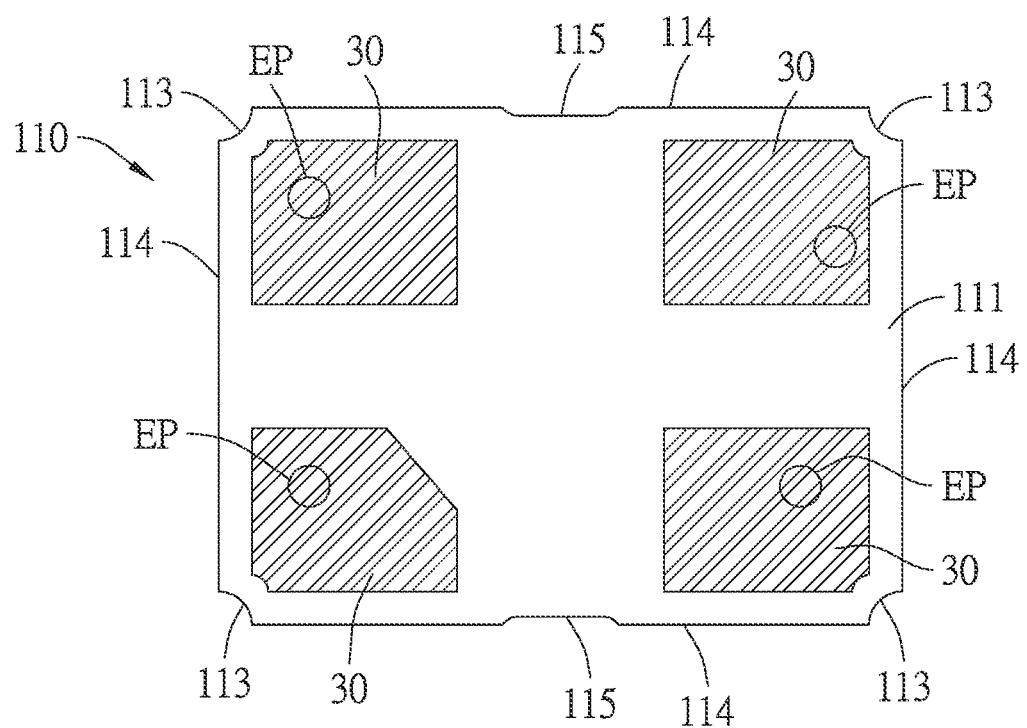
FIG. 4 is a bottom view of a first circuit layer of the micro crystal oscillator according to an embodiment of the present creation, for presenting a plurality of patterned electrodes on the outer surface of the tank bottom.
Figure 5:
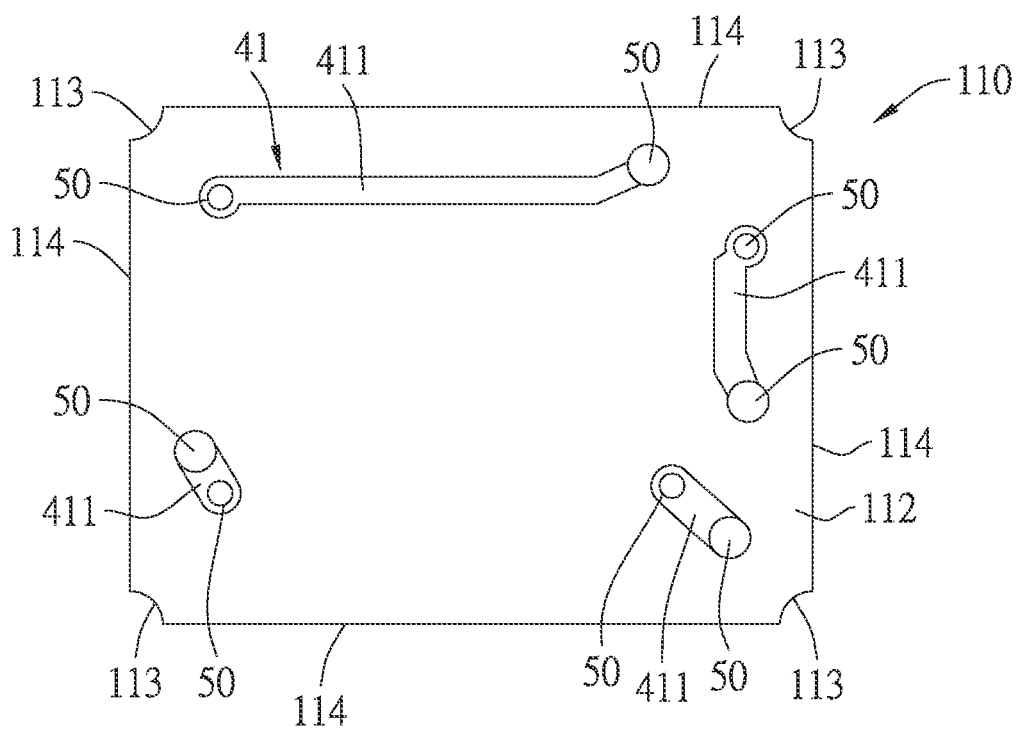
FIG. 5 is a top view of the first circuit layer of the micro crystal oscillator according to an embodiment of the present creation.

The tank bottom 10 further includes two circuit layers 110 (referred to as first circuit layer) and 120 (referred to as second circuit layer) stacked. A lower surface 111 of the circuit layer 110 is the outer surface 12 of the tank bottom 10, an upper surface 112 of the circuit layer 110 contacts a lower surface 121 of the circuit layer 120, and an upper surface 122 of the circuit layer 120 is the inner surface 11 of the tank bottom 10. A plurality of patterned electrodes 30 are provided on the lower surface 111 of the circuit layer 110, as shown in FIG. 4. Each patterned electrode 30 is provided with a contact point EP for electrical connection. A patterned circuit 41 (also referred to as fourth patterned circuit) is provided on the upper surface 112 of the circuit layer 110, as shown in FIG. 5. The patterned circuit 41 includes a plurality of conductive wires 411.

In this embodiment, these patterned electrodes 30 are close to four corners 113 of the circuit layer 110 but do not touch four edges 114 of the circuit layer 110, and the middle areas of the two opposite edges 114 of the circuit layer 110 are also recessed toward the center of the circuit layer 110 to form two recessed areas 115; and however, the present invention is not limited to this embodiment.

Figure 6:
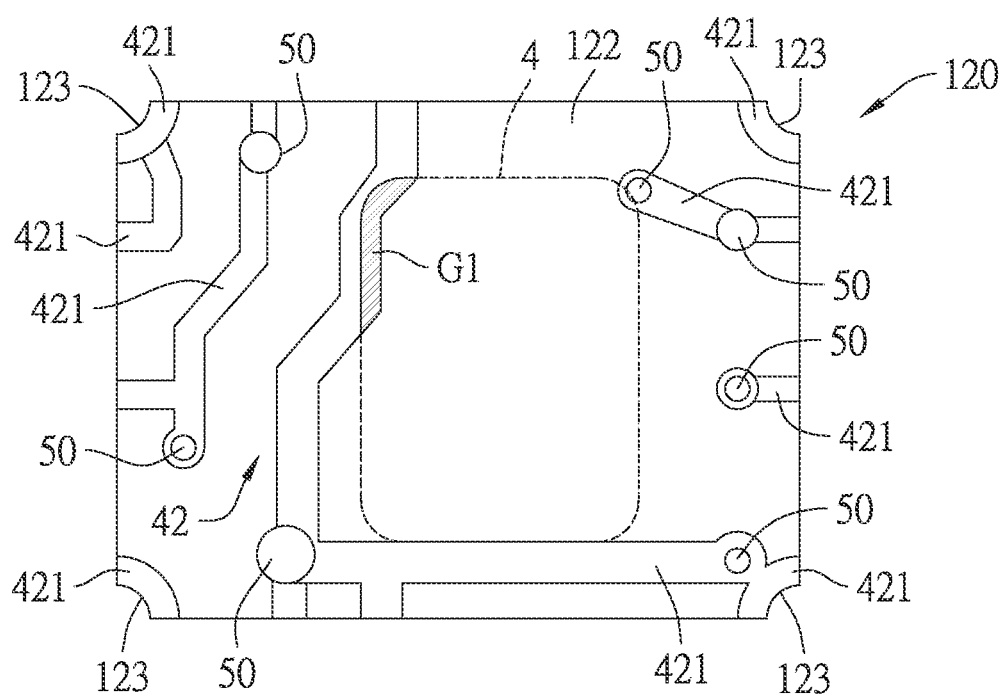
FIG. 6 is a top view of a second circuit layer of the micro crystal oscillator according to an embodiment of the present creation.

The upper surface 122 of the circuit layer 120 is provided with the above-mentioned oscillating chip 4 and a patterned circuit 42 (also referred to as third patterned circuit), as shown in FIG. 6. An opening OP2 of the circuit layer 120 is close to the center of the upper surface 122 of the circuit layer 120 for accommodating the oscillating chip 4. The patterned circuit 42 includes a plurality of conductive wires 421. One of the conductive wires 421 is electrically connected to the oscillating chip 4, so the two overlap each other in a local area G1. In this embodiment, a part of the conductive wires 421 is abutted against the edges of four corners 123; and however, the present invention is not limited to this embodiment.

The side wall 20 includes a plurality of circuit layers 210 (also referred to as third circuit layer), 220 (also referred to as fourth circuit layer), and 230 (also referred to as fifth circuit layer), and the circuit layers 210, 220, and 230 are stacked on the upper surface 122 of the circuit layer 120. That is, a lower surface 211 of the circuit layer 210 contacts the upper surface 122 of the circuit layer 120, the lower surface 221 of the circuit layer 220 contacts an upper surface 212 of the circuit layer 210, a lower surface 231 of the circuit layer 230 contacts an upper surface 222 of the circuit layer 220, and the lower surface of the sealing layer 3 contacts an upper surface 232 of the circuit layer 230. The circuit layers 210, 220, and 230 respectively include openings OP2, OP3, and OP4, and these openings OP2, OP3, and OP4 constitute at least a part of the aforementioned recess R. The opening OP4 is larger than the opening OP3, and the opening OP3 is larger than the opening OP2.

Figure 7:
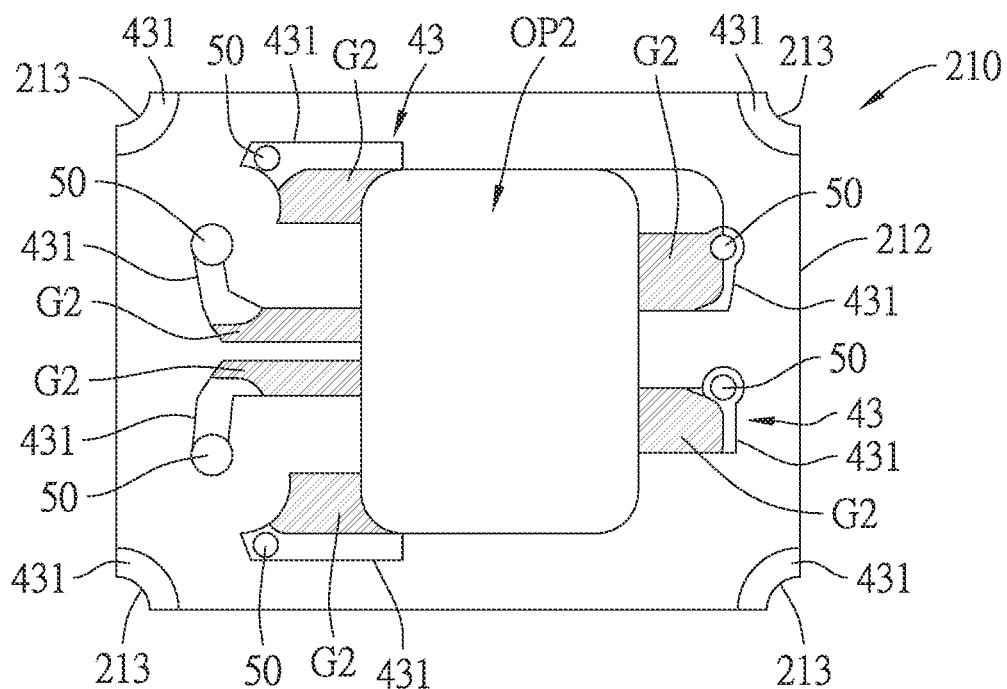
FIG. 7 is a top view of a third circuit layer of the micro crystal oscillator according to an embodiment of the present creation.

A patterned circuit 43 (also referred to as first patterned circuit) is provided on the upper surface 212 of the circuit layer 210, as shown in FIG. 7. The patterned circuit 43 includes a plurality of conductive wires 431. The opening OP2 of the circuit layer 210 further exposes (or shows) the oscillating chip 4 on the circuit layer 120, so that after the packaging board 2 is removed, the oscillating chip 4 can be seen from the opening OP1 of the tank body 1. In this embodiment, a part of the conductive wires 431 is abutted against the edges of the four corners 213, and the other part of the conductive wires 431 is distributed on two opposite sides of the opening OP3 of the circuit layer 210 and extends to the edges of the opening OP3 of the circuit layer 210; and however, this invention is not limited to this embodiment.

Figure 8:
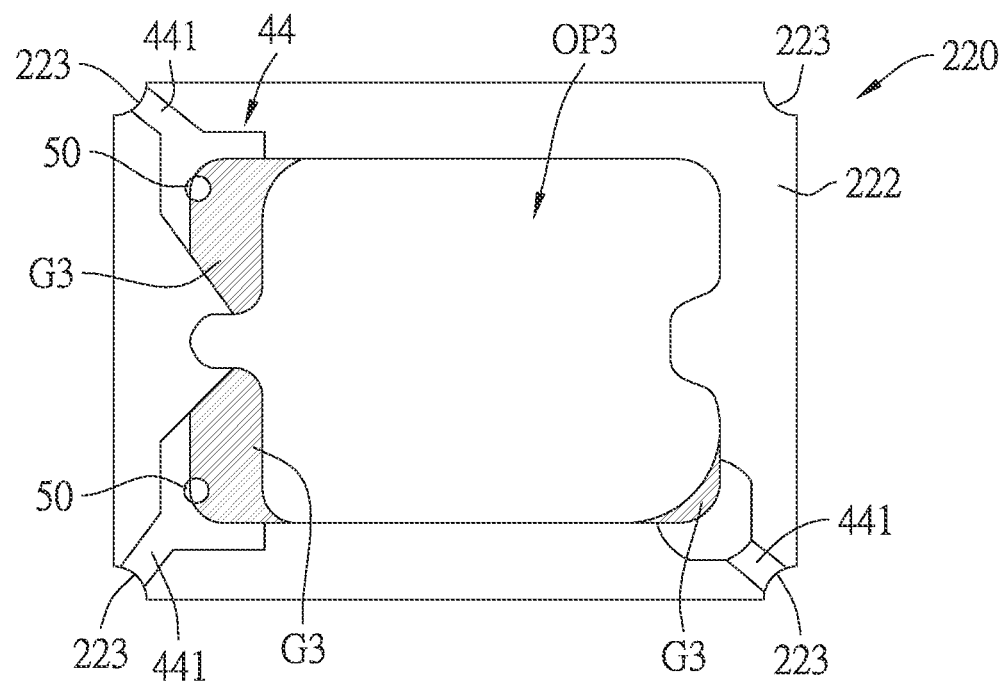
FIG. 8 is a top view of a fourth circuit layer of the micro crystal oscillator according to an embodiment of the present creation.

A patterned circuit 44 (also referred to as second patterned circuit) is provided on the upper surface 222 of the circuit layer 220, as shown in FIG. 8. The patterned circuit 44 includes three conductive wires 441. The opening OP3 of the circuit layer 220 further exposes (or reveals) local areas G2 of the plurality of conductive wires 431 of the patterned circuit 43 on the circuit layer 210, so that after the packaging board 2 is removed, these local areas G2 can be seen from the opening OP1 of the tank body 1. In this embodiment, the three conductive wires 441 are abutted against the edges of the three corners 223, but the present invention is not limited to this embodiment.

In addition, the opening OP4 of the circuit layer 230 can expose (or reveal) local areas G3 of the plurality of conductive wires 441 of the patterned circuit 44 on the circuit layer 220, so that after the package board 2 is removed, these local areas G3 can be seen from the opening OP1 of the tank body 1.

The above-mentioned circuit layers 110 to 230 are mainly made of insulating materials, so the patterned electrodes 30 and the patterned circuits 41 to 44 can be separated from one another and electrically insulated. These patterned electrodes 30 and the patterned circuits 41 to 44 can be selectively and electrically connected via a plurality of vias 50 according to circuitry requirements, as shown in FIGS. 4 to 8.

Figure 9:
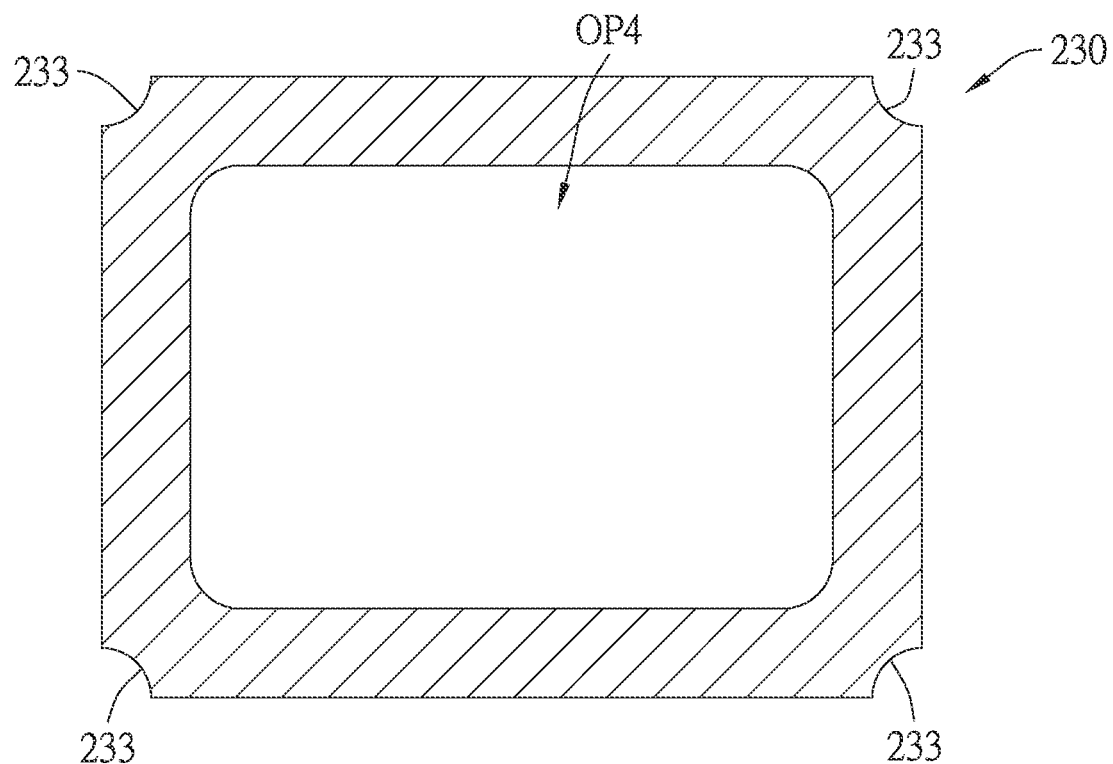
FIG. 9 is a top view of a fifth circuit layer of the micro crystal oscillator according to an embodiment of the present creation.
Figure 10:
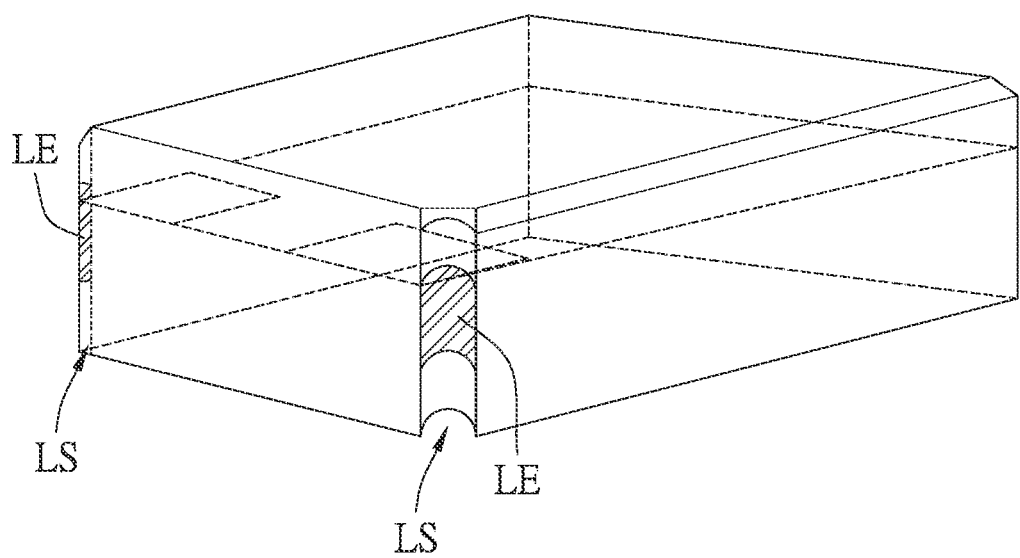
FIG. 10 is a schematic diagram of lateral electrodes of a micro crystal oscillator according to an embodiment of the present invention.

In addition to the above-mentioned vias 50, the present invention also contemplates other conductive structures for selectively and electrically connecting these patterned electrodes 30 and patterned circuits 41 to 44 according to circuitry requirements. In this embodiment, the four corners 113 of the circuit layer 110 are recessed toward the center of the circuit layer 110 to form arc corners, as shown in FIG. 5; the four corners 123 of the circuit layer 120 are recessed toward the center of the circuit layer 120 to form arc corners, as shown in FIG. 6; the four corners 213 of the circuit layer 210 are recessed toward the center of the circuit layer 210 to form arc angles, as shown in FIG. 7; the four corners 223 of the circuit layer 220 are recessed toward the center of the circuit layer 220 to form arc angles, as shown in FIG. 8; and four corners 233 of the circuit layer 230 are recessed toward the center of the circuit layer 230 to form arc angles, as shown in FIG. 9. Therefore, the corresponding corners of the circuit layers 110, 120, 210, 220, and 230 can jointly form four long grooves LS, as shown in FIG. 10. In addition, one or more of the four long grooves LS (that is, the outer surface of the side wall 20 at the corners) can be provided with a lateral electrode LE, so that the circuit layer with one or more conductive wires in the corners can be electrically connected to each other by the lateral electrode LE. For example, since the conductive wire 441 of the patterned circuit 44 of the circuit layer 220 contacts the lateral electrode LE disposed in the corner 223, and the conductive wire 421 of the patterned circuit 42 of the circuit layer 120 contacts the lateral electrode LE disposed in the corner 123, the patterned circuit 44 of the circuit layer 220 can be electrically connected to the patterned circuit 42 of the circuit layer 120 via the lateral electrode LE.

In addition, the oscillating chip 4 can be electrically connected to the patterned circuit 43 through the above-mentioned connecting wires 5. Specifically, the two opposite ends of each connecting wire 5 are respectively connected to the contact point of the oscillating chip 4 and the contact point of the conductive wire 431 (especially the local area G2 of the conductive wire 431) of the patterned circuit 43 in a wire bonding manner. Thus, the electrical connection between the oscillating chip 4 and the patterned circuit 43 is realized.

By the above-mentioned space planning design on the package structure of the micro crystal oscillator, the wire bonding technology that was originally only suitable for large-size package structures can be applied to small-size packages, such as packages with a maximum length of less than 2 mm, and it is not necessary to replace the packaging equipment using the wire bonding technology with the packaging equipment using the flip chip bonding technology that is suitable for small-size packaging. Moreover, such a package structure can be applied to the manufacture of crystal oscillators such as, but not limited to, clock crystal oscillators, temperature-compensated crystal oscillators, voltage-controlled crystal oscillators, and the like.

In addition, the above-mentioned descriptions related to the positions, shapes, and connection relationships of the respective electrodes and patterned circuits are for only illustrative purposes in this invention, but not to limit the possible implementation of this invention. In fact, the positions, shapes, and connection relationships of the respective electrodes and patterned circuits can be designed according to actual functional requirements of respective circuits.

Although this invention is disclosed above with the foregoing embodiments, these embodiments are not intended to limit the invention. Without departing from the spirit and scope of this invention, all changes, modifications, and combinations of implementation patterns are within the scope of patent protection of this invention. For the scope of protection defined by this invention, please refer to the attached claims.

What is claimed is:

1. A micro crystal oscillator, comprising:
   a tank body including a tank bottom and a side wall, the tank bottom including an inner surface and an outer surface, wherein the side wall is disposed on a periphery of the inner surface of the tank bottom to form a recess together with the tank bottom;
   a plurality of patterned electrodes arranged on the outer surface of the tank bottom;
   a first patterned circuit arranged to the side wall;
   a plurality of vias disposed in the tank body for electrically connecting at least one patterned electrode of the plurality of patterned electrodes to the first patterned circuit;
   an oscillating chip arranged on the inner surface of the tank bottom and located in the recess;
   a plurality of connecting wires located in the recess and respectively connecting the oscillating chip to the first patterned circuit in a wire bonding manner, wherein the micro crystal oscillator is millimeter-sized;

a second patterned circuit disposed to the side wall and located above the first patterned circuit that is located between the second patterned circuit and the tank bottom;

at least one lateral electrode disposed on an outer surface of the side wall;

a third patterned circuit disposed on the inner surface of the tank bottom and located between the first patterned circuit and the outer surface of the tank bottom; and a fourth patterned circuit disposed between the inner surface and the outer surface of the tank bottom;

wherein the first patterned circuit, the second patterned circuit, the third patterned circuit, the fourth patterned circuit and at least one patterned electrode of the plurality of patterned electrodes are separated from each other and electrically connected to each other through the plurality of vias.

2. The micro crystal oscillator as claimed in claim 1, wherein a maximum length of the micro crystal oscillator is L, and the micro crystal oscillator meets the following condition: 1 mm<L<2 mm.

3. The micro crystal oscillator as claimed in claim 2, wherein the micro crystal oscillator meets the following condition: 1.6 mm≤L≤1.7 mm.

4. The micro crystal oscillator as claimed in claim 2, wherein a size of the micro crystal oscillator is 1.65 mm×1.25 mm.

5. The micro crystal oscillator as claimed in claim 1, wherein the side wall is rectangular, and the lateral electrode is located at one of four corners of the side wall.

6. The micro crystal oscillator as claimed in claim 1, wherein the second patterned circuit is electrically connected to the third patterned circuit via the at least one lateral electrode.

7. The micro crystal oscillator as claimed in claim 1, wherein the side wall is rectangular, and the lateral electrode is located at one of four corners of the side wall.

8. The micro crystal oscillator as claimed in claim 1, wherein the second patterned circuit includes at least one conductive wire, the conductive wire is abutted against an outer surface of the side wall, and a part of the conductive wire extends to the outer surface of the side wall to contact the lateral electrode.

9. A micro crystal oscillator, comprising:

a tank body including a tank bottom and a side wall, the tank bottom including an inner surface and an outer surface, wherein the side wall is disposed on a periphery of the inner surface of the tank bottom to form a recess together with the tank bottom;

a plurality of patterned electrodes arranged on the outer surface of the tank bottom;

a first patterned circuit arranged to the side wall;

a plurality of vias disposed in the tank body for electrically connecting at least one patterned electrode of the plurality of patterned electrodes to the first patterned circuit;

an oscillating chip arranged on the inner surface of the tank bottom and located in the recess;

a plurality of connecting wires located in the recess and respectively connecting the oscillating chip to the first patterned circuit in a wire bonding manner, wherein the micro crystal oscillator is millimeter-sized;

a second patterned circuit disposed to the side wall, wherein the second patterned circuit is located above the first patterned circuit and separated from the first patterned circuit, the first patterned circuit is located between the second patterned circuit and the tank bottom, and the plurality of vias electrically connect at least one patterned electrode of the plurality of patterned electrodes, the first patterned circuit and the second patterned circuit to one another; and at least one lateral electrode disposed on an outer surface of the side wall;

wherein the second patterned circuit includes at least one conductive wire, the conductive wire is abutted against an outer surface of the side wall, and a part of the conductive wire extends to the outer surface of the side wall to contact the lateral electrode.

10. The micro crystal oscillator as claimed in claim 9, wherein a maximum length of the micro crystal oscillator is L, and the micro crystal oscillator meets the following condition: 1 mm<L<2 mm.

11. The micro crystal oscillator as claimed in claim 10, wherein the micro crystal oscillator meets the following condition: 1.6 mm≤L≤1.7 mm.

12. The micro crystal oscillator as claimed in claim 9, wherein a size of the micro crystal oscillator is 1.65 mm×1.25 mm.

13. The micro crystal oscillator as claimed in claim 9, wherein the side wall is rectangular, and the lateral electrode is located at one of four corners of the side wall.

14. The micro crystal oscillator as claimed in claim 9, further comprising a third patterned circuit disposed on the inner surface of the tank bottom, wherein the third patterned circuit is located between the first patterned circuit and the outer surface of the tank bottom, and the plurality of vias electrically connect at least one patterned electrode of the plurality of patterned electrodes, the first patterned circuit and the third patterned circuit to one another.

15. The micro crystal oscillator as claimed in claim 9, further comprising a fourth patterned circuit disposed between the inner surface and the outer surface of the tank bottom, wherein the plurality of vias electrically connect at least one patterned electrode of the plurality of patterned electrodes, the first patterned circuit and the fourth patterned circuit to one another.

* * * * *